United States Patent
Omagari

(10) Patent No.: US 8,154,253 B2
(45) Date of Patent: Apr. 10, 2012

(54) CELL VOLTAGE ABNORMALITY DETECTOR AND CELL VOLTAGE MONITORING DEVICE FOR A MULTI-CELL SERIES BATTERY

(75) Inventor: Kazuya Omagari, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 414 days.

(21) Appl. No.: 12/209,771

(22) Filed: Sep. 12, 2008

(65) Prior Publication Data
US 2009/0179650 A1 Jul. 16, 2009

(30) Foreign Application Priority Data
Sep. 14, 2007 (JP) .................. 2007-239349

(51) Int. Cl.
H02J 7/00 (2006.01)
H02J 7/04 (2006.01)
G01N 27/416 (2006.01)
G01N 27/27 (2006.01)

(52) U.S. Cl. ........ 320/134; 320/116; 320/120; 320/121; 320/149; 320/155; 324/426; 324/433; 369/30.36; 369/53.12; 369/53.42; 340/636.1; 340/636.21

(58) Field of Classification Search .................. 320/134, 320/149, 155; 324/426, 433; 369/30.36, 369/53.12, 53.42; 340/636.01, 636.21
See application file for complete search history.

(56) References Cited

U.S. PATENT DOCUMENTS

| | | | | |
|---|---|---|---|---|
| 6,075,366 | A * | 6/2000 | Yasuda | 324/380 |
| 6,498,738 | B1 * | 12/2002 | Orita et al. | 363/73 |
| 7,193,480 | B2 * | 3/2007 | Ishida et al. | 331/57 |
| 7,352,155 | B2 * | 4/2008 | Li et al. | 320/118 |
| 7,397,221 | B2 * | 7/2008 | Sakuma et al. | 320/134 |
| 7,615,966 | B2 | 11/2009 | Houldsworth et al. | |
| 2001/0011881 | A1 * | 8/2001 | Emori et al. | 320/116 |
| 2006/0028179 | A1 * | 2/2006 | Yudahira et al. | 320/133 |
| 2008/0278172 | A1 * | 11/2008 | Miyamoto | 324/433 |

* cited by examiner

*Primary Examiner* — Patrick Assouad
*Assistant Examiner* — Steve T. Chung
(74) *Attorney, Agent, or Firm* — William B. Kempler; Wade J. Brady, III; Frederick J. Telecky, Jr.

(57) ABSTRACT

A circuit for detecting battery cell abnormalities in a multi-cell series battery for effectively and quickly detecting abnormalities with a simple, small circuit that provides improved reliability, safety and service life of the multi-cell series battery. In the voltage monitoring device 12, immediately after the start of the monitoring cycle of any battery cell $BT_i$, cell voltage abnormality detector 14 checks whether cell voltage $V_i$ is outside of the normal operating range. The cell voltage abnormality detector 14 has: a group of selection switches 18 for selecting any battery cell BT of multi-cell series battery 10 and retrieving its voltage to first and second monitoring terminals A, B; cell voltage/monitoring current converter 20; monitoring current/monitoring voltage converter 22; comparison/evaluation circuit 24; evaluation signal output circuit 26 and abnormality detection controller 28.

22 Claims, 4 Drawing Sheets

CELL VOLTAGE ABNORMALITY DETECTOR AND CELL VOLTAGE MONITORING DEVICE FOR A MULTI-CELL SERIES BATTERY

FIELD OF THE INVENTION

The present invention pertains to a cell voltage monitoring device for monitoring the voltage of each cell of a multi-cell series battery having plural series-connected cells. Specifically, the present invention pertains to a cell voltage abnormality detector that detects battery cell voltage abnormalities.

BACKGROUND OF THE INVENTION

The power supply of the electric motor of electrically powered or hybrid electric vehicles is a multi-cell series battery in which plural battery cells are connected in series to produce the desired driving voltage. The battery cells of the aforementioned multi-cell series battery are secondary batteries which store the electric power generated by the electric motor; the voltage of the battery cell increases as it is charged and decreases as it is discharged. However, over-charging and discharging the battery cell leads to the degradation not only of the torque characteristics of the electric motor, thereby affecting vehicle performance, but also of the service life of the battery cell itself. Consequently, there should be a cell voltage abnormality detector or cell voltage monitoring device that monitors the voltage of each battery cell so that if the cell is being over-charged or discharged this abnormality can quickly be detected and reported to the controller, etc.

In a typical cell voltage abnormality detector of the prior art, as described in Japanese Kokai Patent Application No. 2001-327091, for example, each of the battery cells that form the multi-cell series battery is connected in parallel with a cell voltage detection element, and the sum of the currents flowing in all of the cell voltage detection elements is detected by an element current detection means or current transformer. The detected total current value is then compared with a reference value by means of comparison means, which determines whether battery cell abnormalities have taken place.

A schematic of the device used to detect or measure the voltage of the various battery cells of a multi-cell series battery shows the function of detecting cell voltage abnormalities (over-charging and discharging). For example, the cell voltage detector described in Japanese Kokai Patent Application No. 2001-20152 includes a cell selection switch, a sampling switch for sampling the voltage of the selected battery cell, a capacitor that is charged by the sampled voltage, and a transfer switch that transfers the sampled voltage to an A/D converter after the sampling switch is turned off. By comparing the measured digital current value obtained from the output of the A/D converter with a reference value, it can detect an abnormality (over-charging or discharging).

However, the cell voltage abnormality detector described in Japanese Kokai Patent Application No. 2001-327091 has a complex circuit constitution since each battery cell has a cell voltage detection element and is large and costly since an element current detection means (current transformer) is required to detect the sum of the currents flowing in all of the cell voltage detection elements. Moreover, random cells cannot be identified and checked, which is inconvenient and limits the utility of the detector.

The cell voltage detector described in Japanese Kokai Patent Application No. 2001-20152, on the other hand, is time-intensive since before the state of the battery cell selected from the multi-cell series battery by the cell selection switch can be determined, time is required for charging the capacitor via the sampling switch, for pulling down the potential of the capacitor to ground via the transfer switch and then for transfer to the A/D converter, and also for A/D conversion by the A/D converter. Consequently, abnormality detection is delayed, but a delay in detecting a battery abnormality in an electric vehicle, etc., can be fatal to safe battery operation. Also, in this case, the constitution of the voltage detector (particularly the sampling switch, capacitor and transfer switch) and its operation (switching operation, charging/discharging operation) is complicated. Moreover, when an abnormality of the measured cell voltage value is found, there is no way to determine whether it is actually a cell voltage abnormality or a problem with the measurement circuit, which is also undesirable.

SUMMARY OF THE INVENTION

A general object of the present invention is to solve the aforementioned problems of the prior art by providing a cell voltage abnormality detector and cell voltage monitoring device that has a simple, small, and efficient circuit constitution with which abnormalities in the battery cells of a multi-cell series battery can be detected quickly and accurately, so that the reliability, safety, and service life of the multi-cell series battery can be improved.

This and other objects and features are attained in accordance with an aspect of the present invention provides a cell voltage abnormality detector for a multi-cell series battery that is used to detect cell voltage abnormalities in a multi-cell series battery made up of plural battery cells connected in series characterized in that it is comprised of the following parts: a selection switch for selecting any of the cells of said multi-cell series battery and retrieving its voltage from between the first and second monitoring terminals; a cell voltage/monitoring current converter, which has a first transistor connected between said first and second monitoring terminals and which converts the voltage of said battery cell selected by said selection switch into a monitoring current; a monitoring current/monitoring voltage converter, which has a second transistor that, in combination with said first transistor, forms a current mirror circuit, and which converts the monitoring current generated by said cell voltage/monitoring current converter into a monitoring voltage; and a comparison/evaluation circuit, which compares said monitoring voltage obtained by said monitoring current/monitoring voltage converter with a prescribed reference voltage and which determines whether the voltage of said battery cell selected by said selection switch is outside of a prescribed normal range.

When the desired battery cell of the multi-cell series battery is selected by the selection switch of the device with said constitution, a current corresponding to the voltage of the corresponding battery cell between the first and second monitoring terminals flows through the first transistor. As a result, in the current/voltage converter, due to the current mirroring of the current mirror circuit, which comprises the first and second transistors, a current flows that is proportional to the monitoring current with a constant current mirror ratio, and a monitoring voltage is obtained corresponding to said current. The comparison/evaluation circuit compares the monitoring voltage, which corresponds to the monitoring current and thus the voltage of the battery cell with a prescribed relationship, with a prescribed reference voltage, and determines whether the voltage of the battery cell is outside of a prescribed normal range.

A second aspect of the present invention provides a cell voltage abnormality detector for a multi-cell series battery that it is used to detect cell voltage abnormalities in a multi-cell series battery made up of plural battery cells connected in series characterized in that it is comprised of the following parts: a selection switch for selecting any of the cells of said multi-cell series battery and retrieving its voltage from between the first and second monitoring terminals; a cell voltage/monitoring current converter, which has a first transistor connected between said first and second monitoring terminals and which converts the voltage of said battery cell selected by said selection switch into a monitoring current; a current mirror monitoring current generator, which has a second transistor that, in combination with said first transistor, forms a current mirror circuit, and which proportionally generates a current mirror monitoring current that is in a prescribed ratio to said current mirror monitoring current; and a comparison/evaluation circuit, which compares said current mirror monitoring current generated by said current mirror monitoring current generator with a prescribed reference current, and which determines whether the voltage of said battery cell selected by said selection switch is outside of a prescribed normal range.

When the desired battery cell of the multi-cell series battery is selected by the selection switch of the device with the aforementioned constitution, a monitoring current that corresponds to the voltage of the corresponding battery cell between the first and second monitoring terminals flows through the first transistor. As a result, due to the current mirroring of the current mirror circuit comprising the first and second transistors, a current mirror monitoring current proportional to the monitoring current is generated by the current mirror monitoring current generator in a prescribed current mirror ratio. The comparison/evaluation circuit then compares the current mirror monitoring current, which has a prescribed relationship with the monitoring current and thus with the voltage of the corresponding battery cell, with a reference current, and appropriately determines whether the voltage of the corresponding battery cell is outside of a prescribed normal range.

A third aspect of the present invention provides a cell voltage abnormality detector for a multi-cell series battery that is used to detect cell voltage abnormalities in multi-cell series battery made up of plural battery cells connected in series characterized in that it is comprised of the following parts: a selection switch for selecting any of the cells of said multi-cell series battery and retrieving its voltage from between the first and second monitoring terminals; a cell voltage/monitoring current converter, which has a first transistor connected between said first and second monitoring terminals and which converts the voltage of said battery cell selected by said selection switch into a monitoring current; and a comparison/evaluation circuit, which has a second transistor that, in combination with said first transistor, forms a current mirror circuit, and which compares said monitoring current generated by said cell voltage/monitoring current converter with a prescribed reference current, and judges whether the voltage of said battery cell selected by said selection switch is outside of a prescribed normal range.

When the desired battery cell of the multi-cell series battery is selected by the selection switch of the device with said constitution, a monitoring current, which corresponds to the voltage of the corresponding battery cell between the first and second monitoring terminals, flows through the first transistor. As a result, due to the current mirroring of the current mirror circuit comprising the first and second transistors, a current mirror monitoring current that is proportional to the monitoring current in a prescribed current mirror ratio is generated. The comparison/evaluation circuit, to which the current mirror monitoring current flows, compares the monitoring current with a reference current, and appropriately determines whether the voltage of the battery cell is outside of a prescribed normal range.

A fourth aspect of the present invention provides a cell voltage abnormality detector for a multi-cell series battery that is used to detect cell voltage abnormalities in a multi-cell series battery made up of plural battery cells connected in series characterized in that it is comprised of the following parts: a selection switch for selecting any of the cells of said multi-cell series battery and retrieving its voltage from between the first and second monitoring terminals; a first transistor connected between said first and second monitoring terminals; a second transistor which, in combination with said first transistor, forms a first current mirror circuit; a current/voltage converter that converts the current flowing in said second transistor into a monitoring voltage; and a comparison/evaluation circuit, which compares said monitoring voltage obtained by said current/voltage converter with a prescribed reference voltage and which determines whether the voltage of said battery cell selected by said selection switch is outside of a prescribed normal range.

When the desired battery cell of the multi-cell series battery is selected by the selection switch of the device with the aforementioned constitution, a monitoring current that corresponds to the voltage of the corresponding battery cell between the first and second monitoring terminals flows through the first transistor. As a result, due to the current mirroring effect of the current mirror circuit comprising the first and second transistors, a current proportional to the monitoring current flows through the second transistor at a prescribed current mirror ratio, and a monitoring voltage is generated by the current/voltage converter that corresponds to said current flow in the second transistor. The comparison/evaluation circuit compares the monitoring voltage, which is in a prescribed correspondence with the monitoring current and thus with the voltage of the corresponding battery cell, with a prescribed reference voltage, and appropriately determines whether the voltage of the corresponding battery cell is outside of a prescribed normal range.

In an embodiment of the present invention, said current/voltage converter has a third transistor connected in series with said second transistor between said first monitoring terminal and a first power supply voltage terminal; a fourth transistor which, in combination with said third transistor, forms a second current mirror circuit, and a first resistor connected in series with said fourth transistor between the second and third power supply voltage terminals that produce a prescribed voltage drop; said monitoring voltage is retrieved from the node between said fourth transistor and said first resistor; and said comparison/evaluation circuit has a first voltage comparator, which compares said monitoring voltage with a first comparison reference voltage for monitoring the lower threshold and outputs a dual-value evaluation signal that indicates the relative high/low relationship between the two voltages, and a second voltage comparator, which compares said monitoring voltage with a second comparison reference voltage for monitoring the upper threshold and outputs a dual-value evaluation signal indicating the relative high/low relationship between the two voltages.

A fifth aspect of the present invention provides a cell voltage abnormality detector for a multi-cell series battery that is used to detect cell voltage abnormalities in a multi-cell series battery made up of plural battery cells connected in series characterized in that it is comprised of the following parts: a selection switch for selecting any of the cells of said multi-cell series battery and retrieving its voltage from between the first and second monitoring terminals; a first transistor connected between said first and second monitoring terminals; a second transistor which, in combination with said first transistor, forms a first current mirror circuit; a current/voltage converter that converts the current flowing in said second transistor into a first monitoring voltage for monitoring the upper threshold and a second monitoring voltage for monitoring the lower threshold; and a comparison/evaluation circuit, which compares said first and second monitoring voltages obtained by said current/voltage converter with first and second reference voltages, respectively, and which determines whether the voltage of said battery cell selected by said selection switch is outside of a prescribed normal range.

When the desired battery cell of the multi-cell series battery is selected by the selection switch of the device with said constitution, a current corresponding to the voltage of the corresponding battery cell between the first and second monitoring terminals flows through the first transistor. As a result, due to the current mirroring of the current mirror circuit comprising the first and second transistors, a current proportional to the monitoring current flows through the second transistor in a prescribed current mirror ratio, and a first monitoring voltage for monitoring the lower threshold and a second monitoring voltage for monitoring the upper threshold are generated by the current/voltage converter that correspond to the current flow in the second transistor. The comparison/evaluation circuit compares the first and second monitoring voltages of the corresponding battery cell having a prescribed relationship with the voltage of the monitoring current and thus with the voltage of the corresponding battery cell, with the reference voltages for monitoring the lower threshold and upper threshold, respectively, and appropriately determines whether the voltage of the corresponding battery cell is outside a prescribed normal range.

In another embodiment of the present invention, said current/voltage converter has a third transistor connected in series with said second transistor between said first monitoring terminal and a first power supply voltage terminal; a fourth transistor which, in combination with said third transistor, forms a second current mirror circuit; a first resistor connected in series with said fourth transistor between the second and third power supply voltage terminals that produces a prescribed voltage drop; a fifth transistor which, in combination with said third transistor, forms the third current mirror circuit; and a second resistor connected in series with said fifth transistor between said second and third power supply voltage terminals; wherein said first monitoring voltage is retrieved from the node between said fourth transistor and said first resistor, and said second monitoring voltage is retrieved from the node between said fifth transistor and said second resistor.

A sixth aspect of the present invention provides a cell voltage abnormality detector for a multi-cell series battery that is used to detect cell voltage abnormalities in a multi-cell series battery made up of plural battery cells connected in series characterized in that it is comprised of the following parts: a selection switch for selecting any of the cells of said multi-cell series battery and retrieving its voltage from between the first and second monitoring terminals; a first transistor connected between said first and second monitoring terminals; a second transistor which, in combination with said first transistor, forms a first current mirror circuit, and a comparison/evaluation circuit, which compares the current flowing in said second transistor with a reference current, and which determines whether the voltage of said battery cell selected by said selection switch is outside of a prescribed normal range.

When the desired battery cell of the multi-cell series battery is selected by the selection switch of the device with said constitution, a monitoring current, which corresponds to the voltage of the corresponding battery cell between the first and second monitoring terminals, flows through the first transistor. As a result, due to the current mirroring of the current mirror circuit comprising the first and second transistors, a current proportional to the monitoring current flows in the second transistor in a prescribed current mirror ratio. The comparison/evaluation circuit compares the current flowing through the second transistor and has a prescribed relationship with the monitoring current and thus with the voltage of the corresponding battery cell, with a reference voltage, and appropriately determines whether the battery cell voltage is outside of a prescribed normal range.

In another embodiment of the present invention, said comparison/evaluation circuit has a third transistor connected in series with said second transistor between said first monitoring terminal and a first power supply voltage terminal; a fourth transistor which, in combination with said third transistor, forms a second current mirror circuit; a first constant-current source connected in series with said fourth transistor between the second and third power supply voltage terminals that produces a prescribed voltage, a fifth transistor which, in combination with said third transistor, forms a third current mirror circuit; and a second constant current source that is connected in series with said fifth transistor between said second and third power supply voltage terminals and that is used to monitor the upper threshold; wherein a first evaluation signal indicating whether the voltage of said battery cell is lower than a prescribed lower threshold is retrieved from the node between said fourth transistor and said first constant current source, and a second evaluation signal indicating whether the output voltage of said battery cell exceeds a prescribed upper threshold is retrieved from the node between said fourth transistor and said second constant current source.

The seventh aspect of the present invention provides a cell voltage abnormality detector for a multi-cell series battery that is used to detect cell voltage abnormalities in a multi-cell series battery made up of plural battery cells connected in series characterized in that it is comprised of the following parts: a selection switch for selecting any of the cells of said multi-cell series battery and retrieving its voltage from between the first and second monitoring terminals; a first transistor connected between said first and second monitoring terminals; and a comparison/evaluation circuit, which compares the current flowing in said first transistor with a reference current, and which determines whether the voltage of said battery cell selected by said selection switch is outside of a prescribed normal range.

When the desired battery cell of the multi-cell series battery is selected by the selection switch of the device with said constitution, a monitoring current, which corresponds to the voltage of the corresponding battery cell between the first and second monitoring terminals, flows through the first transistor. The comparison/evaluation circuit compares the monitoring current having a prescribed relationship with the monitoring current with the reference current, and it can appropriately determine whether the voltage of the battery cell is outside of a prescribed normal range.

In another embodiment of the present invention, said comparison/evaluation circuit for monitoring a lower threshold, comprises a second transistor which, in combination with said first transistor, forms a first current mirror circuit, a first constant current source connected in series with said second transistor between said first monitoring terminal and a prescribed power supply voltage terminal, and for monitoring an upper threshold, comprises a third transistor which, in combination with said first transistor, forms the second current mirror circuit, and a second constant current source that is connected in series with said third transistor between said first monitoring terminal and said power supply voltage terminal; wherein a first evaluation signal indicating whether the voltage of said battery cell is lower than a prescribed lower threshold is retrieved from the node between said second transistor and said first constant current source, and a second evaluation signal indicating whether the output voltage of said battery cell exceeds a prescribed upper threshold is retrieved from the node between said third transistor and said second constant current source.

In a method, the cell voltage abnormality detector of the present invention has a third resistor connected in series with said first transistor between said first and second monitoring terminals. It is possible to adjust the magnitude of the monitoring current by varying the resistance of said third resistor. In another preferred method, it has an on/off switch connected in series with said first transistor between said first and second monitoring terminals. It is possible to enable or disable the abnormal cell voltage detection operation by turning the switch on or off.

This aspect of the present invention provides a cell voltage monitoring device for a multi-cell series battery that has the aforementioned cell voltage abnormality detector and cell voltage measurement circuit that measures the voltage of each cell of said multi-cell series battery. In the device with said constitution, before the cell voltage measurement circuit measures the voltage of the desired cell, the cell voltage abnormality detector determines whether the corresponding cell voltage is normal or abnormal, so that it is possible to detect cell voltage abnormalities early and to take the appropriate safety measures.

In a method, said cell voltage measurement circuit has the following parts: a sampling switch for sampling the output voltage of said cell selected by said sampling switch, a capacitor charged by the voltage sampled by said sampling switch, an A/D converter that converts the charge voltage on said capacitor into a digital signal, and a transfer switch for transferring the charge voltage of said capacitor to said A/D converter. Also, the following method may be adopted: immediately after the start of the first half period when the voltage of said desired battery cell is selected by said sampling switch, said cell voltage abnormality detector is turned on to determine whether the battery cell voltage is normal or abnormal.

REFERENCE NUMERALS AND SYMBOLS AS SHOWN IN THE DRAWINGS

In the figures, 10 represents a multi-cell series battery, 12 a cell voltage monitoring device, 14, a cell voltage abnormality detector, 16 a cell voltage measurement circuit, 18 a selection switch, 20 a cell voltage/monitoring current converter, 22 a monitoring current/monitoring voltage converter, 24 a comparison/evaluation circuit, 26 an evaluation signal output circuit, 28 an abnormality detection controller, 30 a PMOS transistor, 32 a resistor, 34 an on/off switch, 36 a PMOS transistor, 38 an NMOS transistor, 40, 42 NMOS transistors, 44, 46 resistors, 48, 50, voltage comparators, 52, 54 reference voltage generators, 56, 58 AND-gates, $SH_1$, $SL_1$–$SH_n$, $SL_n$ on/off switches, 60H, 60L sampling switches, 62 a capacitor (flying capacitor), 64H, 64L transfer switches, 66 an A/D converter, 68 a current mirror monitoring generator, 70 a comparison/evaluation circuit

DESCRIPTION OF THE EMBODIMENTS

According to the cell voltage abnormality detector and cell voltage monitoring device for a multi-cell series battery of the present invention with said constitution and operation, voltage abnormalities in the cells of the multi-cell series battery can be detected reliably and quickly using a simple, small and highly efficient circuit. As a result, it is possible to improve the reliability, safety and service life of the multi-cell series battery.

An embodiment of the present invention will be explained below with reference to the attached figures.

Figure 1:
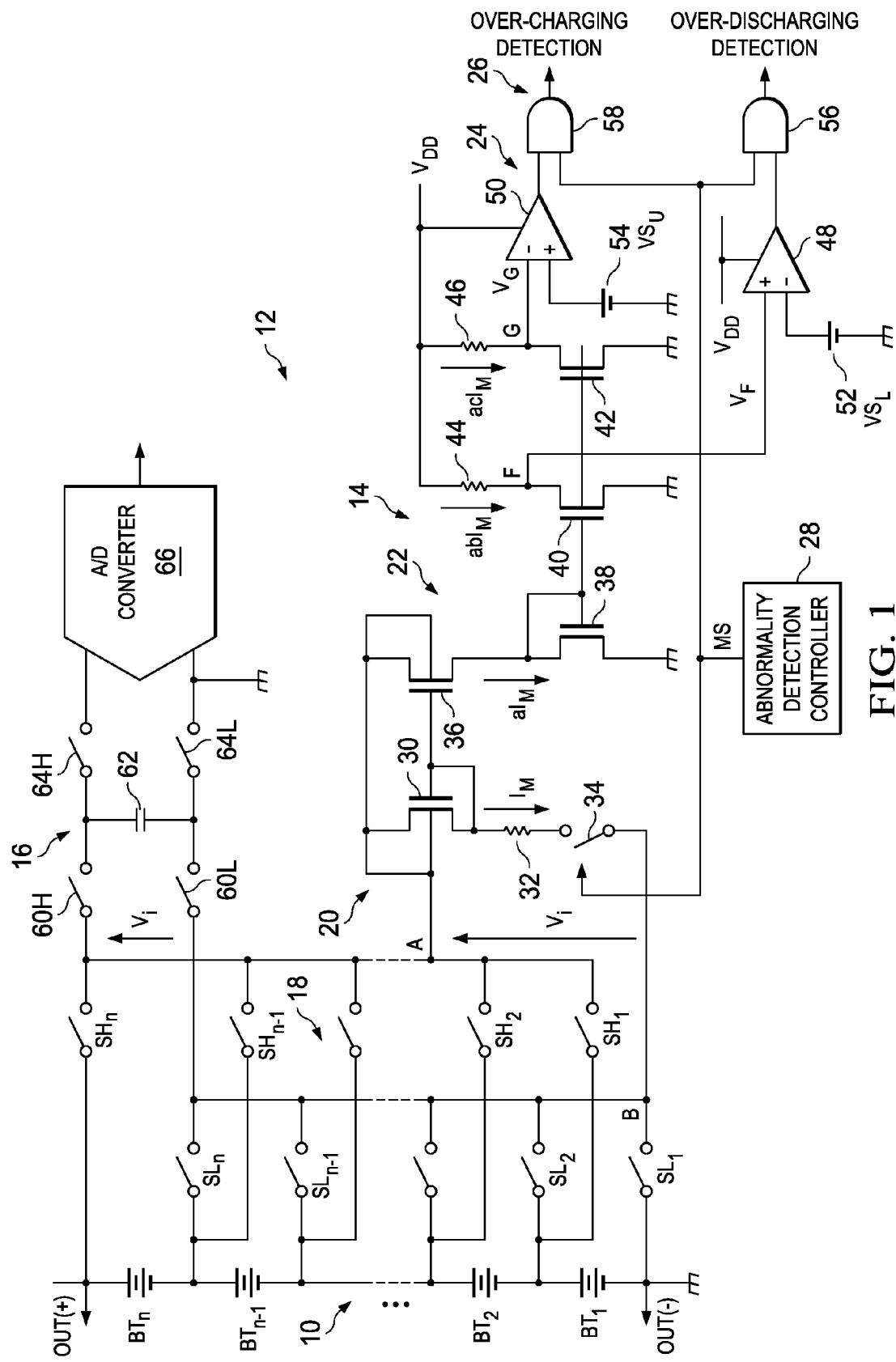
FIG. 1 is a circuit diagram illustrating the circuit constitution of the cell voltage monitoring device for a multi-cell series battery in Embodiment 1 of the present invention.

FIG. 1 is a diagram illustrating the circuit constitution of the cell voltage abnormality detector for a multi-cell series battery in an embodiment of the present invention.

Said multi-cell series battery 10 has a number n of battery cells $BT_1$, $BT_2$ . . . $BT_{n-1}$, $BT_n$ connected in series. Said battery cell BT may be a lithium ion cell, for example, or another type of secondary cell with a constitution for charging/discharging with prescribed charging characteristics and discharge load characteristics. Positive output terminal OUT (+) and negative output terminal OUT (−) of multi-cell series battery 10 are connected to the inverter for driving an electric motor (not shown in the figure) when the load is that of an electric vehicle.

Cell voltage monitoring device 12 for monitoring said multi-cell series battery 10 has cell voltage abnormality detector 14 and cell voltage measurement circuit 16, and the overall device forms a single-chip semiconductor integrated circuit.

Said cell voltage abnormality detector 14 comprises a group of selection switches 18, which select any battery cell BT in units of 1-cell or plural-cell (block) from multi-cell series battery 10 and retrieves its voltage from between first monitoring terminal A and second monitoring terminal B; cell voltage/monitoring current converter 20; monitoring current/monitoring voltage converter 22; comparison/evaluation circuit 24, evaluation signal output circuit 26, and abnormality detection controller 28.

More specifically, said selection switches 18 comprise n groups of on/off switches $SH_i$, $SL_i$ (i=1, 2, . . . , n−1, n) connected between the two terminals of various battery cells $BT_i$ and two monitoring terminals A, B, respectively. For example, if switches $SH_2$, $SL_2$–$SH_n$, $SL_n$ are all off while $SH_1$, $SL_1$ are on, the voltage of battery cell $BT_1$ is retrieved via switches $SH_1$, $SL_1$ to monitoring terminals A, B.

Said cell voltage/monitoring current converter 20 comprises PMOS transistor 30, resistor 32, and on/off switch 34 connected in series between said first monitoring terminal A and second monitoring terminal B. More specifically, the source terminal of PMOS transistor 30 is connected to first monitoring terminal A on the positive electrode side, and its drain terminal and gate terminal are connected to second monitoring terminal B on the negative electrode side via resistor 32 and on/off switch 34.

When switches $SH_i$, $SL_i$ in selection switches 18 are turned on and voltage $V_i$ of battery cell $BT_i$ is retrieved from between monitoring terminals A, B, in cell voltage detector 20, switch 30 is turned on corresponding to abnormality detection control signal MS from abnormality detection controller 28, current $I_M$ (hereinafter referred to as monitoring current $I_M$) flows in PMOS transistor 30 and resistor 32. The aforementioned monitoring current $I_M$ is given by following Equation 1, where $VT_{30}$ represents the threshold voltage of PMOS transistor 30, and $R_{32}$ represents the resistance of resistor 32.

$$I_M = (Vi - VT_{30})/R_{32} \quad (1)$$

Said monitoring current/monitoring voltage converter 22 comprises PMOS transistor 36 and NMOS transistor 38 connected in series between first monitoring terminal A and the ground terminal. More specifically, the source terminal of PMOS transistor 36 is connected to first monitoring terminal A on the positive electrode side, and the drain terminal is connected via NMOS transistor 38 to the ground terminal. The gate terminal of PMOS transistor 36 is connected to the gate terminal and drain terminal of PMOS transistor 30; said two transistors 30, 36 comprise a current mirror circuit.

In cell voltage/monitoring current converter 20, when monitoring current $I_M$ flows, due to the current mirroring of current mirror circuit 30, 36, current $a*I_M$ (hereinafter referred to as primary current mirror monitoring current $a*I_M$) which is proportional to said monitoring current $I_M$ at the desired current mirror ratio a, flows in the series circuit of PMOS transistor 36 and NMOS transistor 38.

In this embodiment, it is preferred that monitoring current $I_M$ be set at a small current value of, e.g., a few μA to a few hundred μA so as to minimize the power consumption in cell voltage/monitoring current converter 20. For this purpose, resistance $R_{32}$ of resistor 32 is selected to be a few K ohMs to a few M ohMs.

In addition, monitoring current/monitoring voltage converter 22 comprises NMOS transistors 40, 42 that, in combination with NMOS transistor 38, form a current mirror circuit, and resistors 44, 46 connected in series with NMOS transistors 40, 42, respectively, between $V_{DD}$ terminal and the ground terminal. More specifically, the source terminals of NMOS transistors 40, 42 are connected to the ground terminal, the drain terminals of NMOS transistors 40, 42 are connected via resistors 44, 46 to $V_{DD}$ terminal, and the gate terminals of NMOS transistors 40, 42 are connected to the gate and drain terminals of NMOS transistor 38.

In monitoring current/monitoring voltage converter 22, when primary current mirror monitoring current $a*I_M$ flows in NMOS transistor 38, due to the current mirroring of current mirror circuit 38, 40, current $ab*I_M$ (hereinafter referred to as first secondary current mirror monitoring current $ab*I_M$), which is proportional to said primary current mirror monitoring current $a*I_M$ at the desired current mirror ratio b, flows in the series circuit of MOS transistor 40 and resistor 44. Also, due to the current mirroring of current mirror circuit 38, 42, current $ac*I_M$ (hereinafter referred to as second secondary current mirror monitoring current $ac*I_M$), which is proportional to primary current mirror monitoring current $a*I_M$ at the desired current mirror ratio c, flows in the series circuit of NMOS transistor 42 and resistor 46.

Here, the ratio of said first secondary current mirror monitoring current $ab*I_M$ to monitoring current $I_M$ is a×b, and that of second secondary current mirror monitoring current $ac*I_M$ to monitoring current $I_M$ is a×c.

If the resistance of resistor 44 is $R_{44}$, then at node F between NMOS transistor 40 and resistor 44, voltage $V_F$ for monitoring the lower threshold or overdischarging (hereinafter referred to as first monitoring voltage $V_F$) is given by Equation 2 below.

$$V_F = V_{DD} - R_{44}*(ab*I_M) \quad (2)$$

Also, if the resistance of resistor 46 is $R_{46}$, then at node G between NMOS transistor 42 and resistor 46, $V_G$ for monitoring the upper threshold or over-charging (hereinafter referred to as second monitoring voltage $V_G$) is given by Equation 3 below.

$$V_G \times V_{DD} - R_{46}*(ac*I_M) \quad (3)$$

As can be seen from said Equations 2, 3, the larger the monitoring current $I_M$ (i.e., the higher the cell voltage $V_M$), the lower the monitoring voltages $V_F$, $V_D$, and the smaller the monitoring current $I_M$ (i.e., the lower the cell voltage $V_M$), the higher the monitoring voltages $V_F$, $V_D$.

Said comparison/evaluation circuit 24 comprises first voltage comparator 48 and second voltage comparator 50 using, e.g., op amps. First monitoring voltage $V_F$ from monitoring current/monitoring voltage converter 22 is input to input terminal (+) of said first voltage comparator 48 on the positive electrode side, and comparison reference voltage $VS_L$ or overdischarging monitoring voltage from reference voltage generator 52 is input to terminal (−) on the negative electrode side. Then, the voltage levels of the two input voltages $V_F$, $VS_L$ are compared. If $V_F*VS_L$, an evaluation signal of logic value L indicating that cell voltage $V_M$ is above a prescribed lower threshold, that is, indicating that corresponding battery cell $BT_i$ is not in the over-discharged state, is input. If $V_F > VS_L$, an evaluation signal of logical value H (overdischarging detection signal) indicating that cell voltage $V_M$ is below a prescribed lower threshold, that is, indicating that said battery cell $BT_i$ in the over-discharged state, is output.

Also, when the voltage falls below a prescribed lower cell voltage where battery cell $BT_i$ is identified as being in the over-discharged state, if the current value of monitoring current $I_M$ flowing in cell voltage/monitoring current converter 20 is $I_{ML}$, comparison reference voltage $VS_L$ for monitoring overdischarging is represented by Equation 4.

$$VS_L = V_{DD} - R_{44}*(ab*I_{ML}) \quad (4)$$

In second voltage comparator 50, comparison reference voltage $VS_U$ for monitoring over-charging is input from reference voltage generator 54 to input terminal (+) on the positive electrode side, and second monitoring voltage $V_G$ is input from monitoring current/monitoring voltage converter 22 to input terminal (−) on the negative electrode side. Then, the voltage levels of the two input voltages $V_G$, $VS_U$ are compared. If $V_G \cdot VS_U$, an evaluation signal of logical value L indicating that cell voltage $V_M$ is below a prescribed upper threshold, that is, indicating that corresponding battery cell $BT_i$ is not in the over-charged state, is input. When $V_G < VS_U$, an evaluation signal of logical value H (over-charging detection signal) indicating that cell voltage $V_M$ is above a prescribed upper threshold, that is, indicating that said battery cell $BT_i$ is in the over-charged state, is output.

Also, when the voltage rises to a prescribed upper cell voltage where battery cell $BT_i$ is identified as being in the overcharged state, if the current value of monitoring current $I_M$ flowing in cell voltage/monitoring current converter 20 is $I_{MU}$, comparison reference voltage $VS_U$ for monitoring the over-charged state is represented by Equation 5.

$$VS_U = V_{DD} - R_{46}*(ac*I_{MU}) \quad (5)$$

Said evaluation signal output circuit 26 comprises first AND-gate 56 and second AND-gate 58, each operating as logic gates. The evaluation signal from first voltage comparator 48 is input to one input terminal of said first AND-gate 56, and abnormality detection control signal MS from abnormality detection controller 28 is input to the other input terminal. The evaluation signal from second voltage comparator 50 is input to one input terminal of said second AND-gate 58 and abnormality detection control signal MS from abnormality detection controller 28 is input to the other input terminal. If abnormality detection control signal MS has logical value L, the outputs of said two AND-gates 56, 58 are forcibly set to logical value L, and the circuits are in the disabled state, that is, in standby mode. If abnormality detection control signal MS has logical value H, said two AND-gates 56, 58 are set to the enabled state, that is, the monitoring output mode, and the evaluation signal from comparison/evaluation circuit 24, specifically, the overdischarging detection signal or the overcharging detection signal of logical value H is output.

The output terminal of evaluation signal output circuit 26 may be connected to a controller (not shown in the figure) that performs overall control of said multi-cell series battery and cell voltage monitoring device. Also, selection switches 18 may also be controlled by said controller, and abnormality detection controller 28 may operate under the control of said controller or be a part of said controller.

In the following, an explanation will be given regarding cell voltage measurement circuit 16. This cell voltage measurement circuit 16 contains said group of selection switches 18, and it also has a pair of selection switches 60H, 60L, capacitor (flying capacitor) 62, a pair of transfer switches 64H, 64L, and A/D converter 66.

More specifically, one selection switch 60H is connected between monitoring terminal A on the positive electrode side and the positive terminal of capacitor 62, and the other selection switch 60L is connected between monitoring terminal B on the negative electrode side and the negative terminal of capacitor 62. One transfer switch 64H is connected between the positive terminal of capacitor 62 and the voltage input terminal of A/D converter 66, and other transfer switch 64L is connected between the negative terminal of capacitor 62 and the ground terminal of A/D converter 66.

In said cell voltage measurement circuit 16, when the voltage of battery cell $BT_i$ of multi-cell series battery 10 is measured, two transfer switches 64H, 64L are turned off, and only switches $SH_i$, $SL_i$ among selection switches 18 are turned on, so that the voltage of battery cell $BT_i$ is retrieved to monitoring terminals A, B. In this state, said selection switches 60H, 60L are turned on, and capacitor 62 is charged by the voltage of battery cell $BT_i$. Once said capacitor is charged, selection switches 18 and two selection switches 60H, 60L are turned off, and battery cell $BT_i$ is electrically cut off from capacitor 62. Then, transfer switch 64L on the negative electrode side is first turned on, so that the negative terminal of capacitor 62, that is, its potential with respect to ground, is pulled down to ground potential. After a short delay, transfer switch 64H on the positive terminal side is also turned on. As a result, the charge voltage on capacitor 62, obtained as a copy of voltage $V_i$ of battery cell $BT_i$, is transferred to A/D converter 66 via two transfer switches 64H, 64L. The digital signal obtained from A/D converter 66 is sent as the cell voltage measurement value to said controller.

Figure 2:
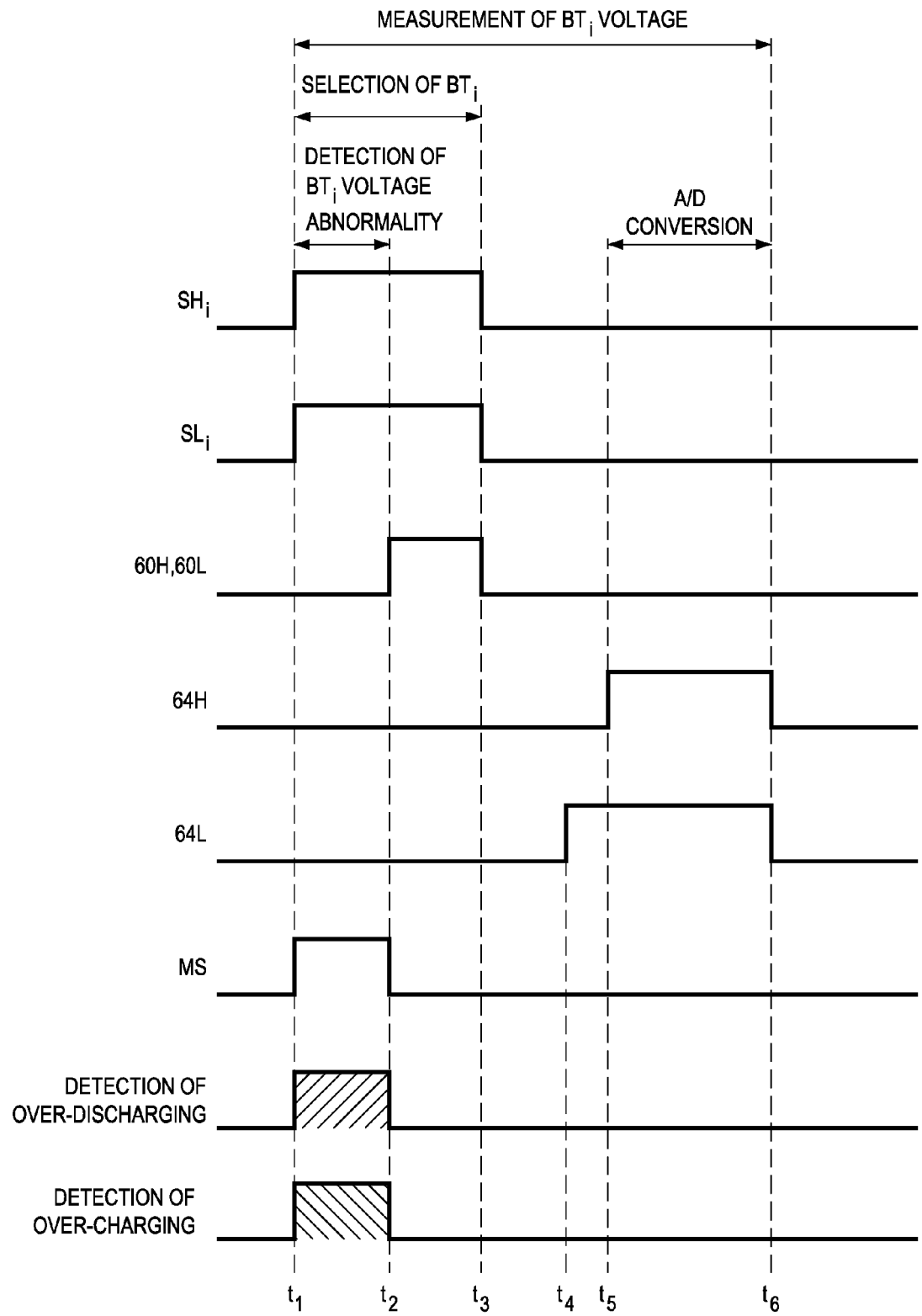
FIG. 2 is a timing diagram illustrating the overall operation of the cell voltage monitoring device of Embodiment 1.

In the following, an explanation will be given regarding the overall operation of said cell voltage monitoring device with reference to FIG. 2. FIG. 2 is a diagram illustrating the waveforms at the various parts of the circuit for any one battery cell $BT_i$ when cell voltage abnormality detection and cell voltage measurement are performed. For the overall multi-cell series battery 10, the monitoring cycle shown in the figure may be cycled cell by cell from battery cell $BT_1$ to battery cell $BT_n$.

Immediately before the start of the monitoring cycle, all of the switches in the device are turned off. When the monitoring cycle is started, first, switches $SH_i$, $SL_i$ of selection switches 18 are turned on, and, at the same time, abnormality detection control signal MS has active logical value H.

Since selected switches $SH_i$, $SL_i$ are turned on, voltage $V_i$ of corresponding battery cell $BT_i$ is retrieved from monitoring terminals A, B via switches $SH_i$, $SL_i$.

In cell voltage abnormality detector 14, on/off switch 34 is turned on corresponding to abnormality detection control signal MS of logical value H by means of cell voltage/monitoring current converter 20, and monitoring current $I_M$ represented by Equation 1 flows between monitoring terminals A, B.

As a result, due to the aforementioned current mirroring effect, primary current mirror monitoring current $a^*I_M$, first secondary current mirror monitoring current $ab^*I_M$ and second secondary current mirror monitoring current $ac^*I_M$ flow in the various parts of monitoring current/monitoring voltage converter 22, and first monitoring voltage $V_F$ and second monitoring voltage $V_G$ are obtained at nodes F and G, respectively.

In comparison/evaluation circuit 24, monitoring voltages $V_F$, $V_G$ are compared to comparison reference voltages $VS_L$, $VS_U$ for monitoring overdischarging and over-charging, respectively, and based on the comparison results, the first and second evaluation signals are generated. As a result, if overdischarging detection signal of logical value H is obtained in first voltage comparator 48, or if over-charging detection signal is obtained in second voltage comparator 50, these abnormality detection signals are quickly sent to the controller through evaluation signal output circuit 26.

Said cell voltage abnormality detector 14 operates during the period when abnormality detection controller 28 keeps abnormality detection control signal MS in the active state (with logical value H). The active period of said signal MS or the pulse width ($t_1$ to $t_2$) is preferably as short as possible while the power consumption of battery cell $BT_i$ is minimized. For example, it may be set in the range of a few μsec to a few hundred μsec.

For cell voltage detector 16 immediately after abnormality detection control signal MS goes to inactive logical value L (time $t_2$) in cell voltage abnormality detector 14, sampling switches 60H, 60L are turned on. As a result, a closed circuit is formed between battery cell $BT_i$ and capacitor 62 via switches $SH_i$, $SL_i$ in the on state and sampling switches 60H, 60L, and the charging current is fed from battery cell $BT_i$ to capacitor 62. In this way, capacitor 62 is charged until its voltage reaches voltage $V_i$ of battery cell $BT_i$. After a prescribed time (to time $t_3$) from the start of charging, sampling switches 60H, 60L are turned off, and battery cell $BT_i$ is electrically cut off from capacitor 62.

After a prescribed time (time $t_4$), transfer switch 64L on the negative electrode side is first turned on, and the negative terminal of capacitor 62, that is, its potential with respect to ground, is pulled down to ground potential, and transfer switch 64H on the positive electrode side is also turned on not later than time $t_5$. As a result, the charge voltage on capacitor 62, obtained as a copy of the voltage of battery cell $BT_i$ is transferred to A/D converter 66 via two transfer switches 64H, 64L. Said A/D converter 66 converts the retrieved analog voltage $V_i$ into a digital signal, and the digital signal is sent as the cell voltage measurement value to the controller.

As explained above, for cell voltage monitoring device 12 in this embodiment, immediately after the start of the monitoring cycle with respect to any battery cell $BT_i$, that is, immediately after voltage $V_i$ of battery cell $BT_i$ is sent to monitoring terminals A, B, cell voltage abnormality detector 14 is turned on, and it checks whether cell voltage $V_i$ is outside of the normal range. If battery cell $BT_i$ indicates an abnormality (overdischarging or over-charging), before the A/D conversion of cell voltage $V_i$ detected by cell voltage detector 16, an evaluation signal indicating the abnormality is output from cell voltage abnormality detector 14, and the controller can quickly perform the required process on the cell voltage abnormality. As a result, it is possible to enhance the overall safe operation of the load and system, and at the same time, it is possible to prevent damage to the battery cells and prolong the service life.

With respect to said cell voltage abnormality detector 14, even when there is a problem with the operation of cell voltage detector 16, particularly in the vicinity of capacitor (flying capacitor) 62, cell voltage abnormality detector 14 is still immune to its influence, and it can appropriately assess whether a cell voltage abnormality has occurred. On the other hand, with respect to cell voltage detector 16, because the operation of cell voltage detector 16 comes to an end before capacitor 62 is charged (because switch 34 is turned off), the charging of capacitor 62 is unaffected. That is, cell voltage detector 16 does not adversely influence the cell voltage measurement circuit 16, (no measurement errors are produced).

Also, with cell voltage abnormality detector 14, the voltages of a plurality (e.g., tens) of battery cells $BT_1$–$BT_n$ that form a multi-cell series battery 10 can all be detected with a single voltage detection means (cell voltage/monitoring current converter 20). Also, there is no need to use a current transformer or other external components, the power consumption is low, and the circuit scale and overall size can also be significantly reduced. In addition, cell voltage detector 16 and selection switches 18 can be shared, which also improves the efficiency of the circuit constitution.

Also, when a battery cell, e.g., battery cell $BT_n$, near input terminal (+) on the positive electrode side of multi-cell series battery 10 is selected, a high voltage (e.g., 50-60V) is applied to monitoring terminals A, B. However, since monitoring current $I_M$ generated by cell voltage/monitoring current converter 20 is transmitted via the current mirror circuit to the next stage as well as the later stages, it is possible to perform signal processing for detecting abnormalities using power supply voltage $V_{DD}$ with a low voltage (e.g., 3.3 V) in monitoring current/monitoring voltage converter 22 and comparison/evaluation circuit 24. As a result, by simply using a few high-voltage MOS elements with LOCOS offset between the drain and gate in PMOS transistors 30, 36, etc., semiconductor integrated circuit can be easily formed, and the risk of breakdown at high voltages can be reduced.

Figure 3:
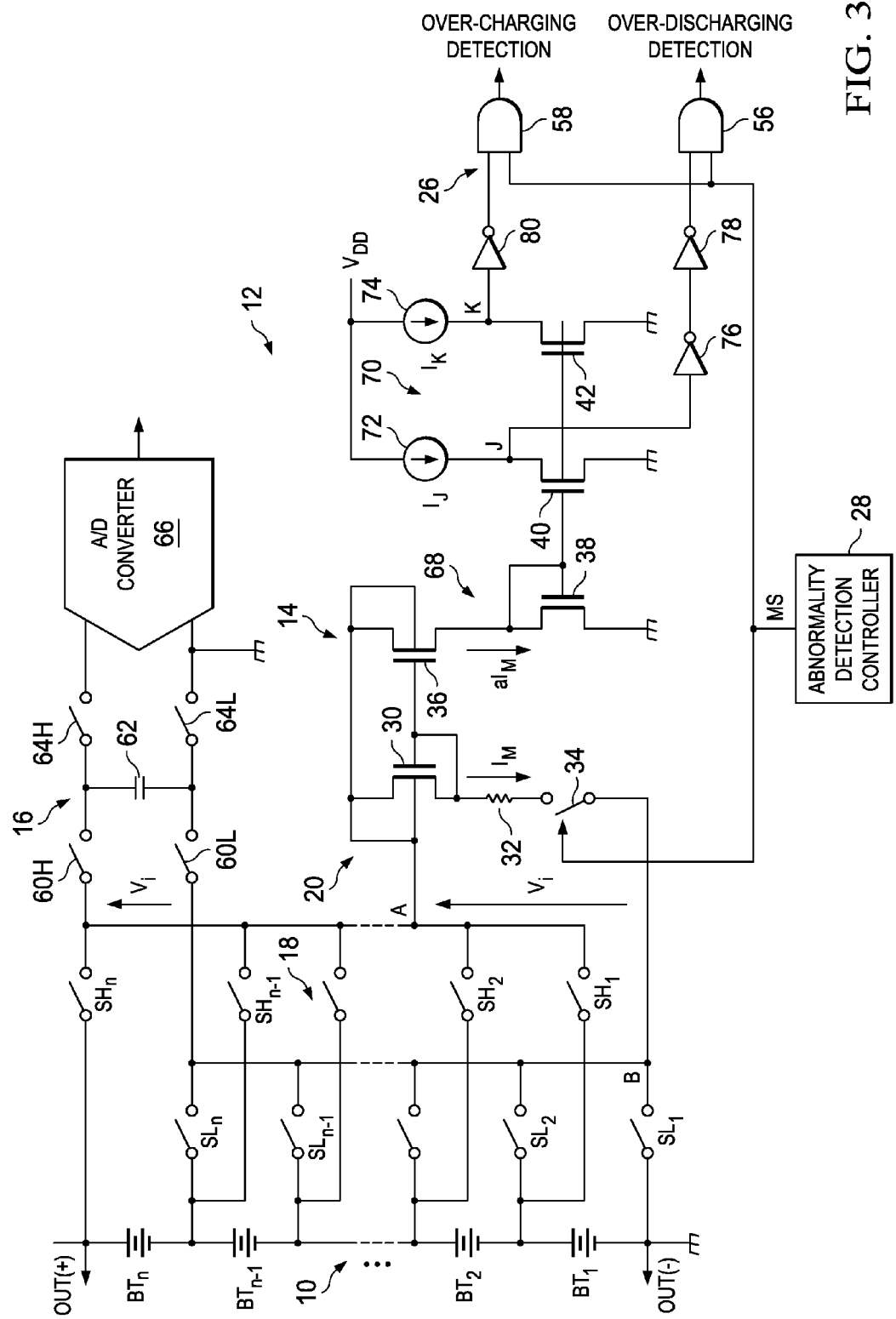
FIG. 3 is a circuit diagram illustrating the circuit constitution of the cell voltage monitoring device for a multi-cell series battery in Embodiment 2.

FIG. 3 is a diagram illustrating the circuit constitution of the cell voltage monitoring device of Embodiment 2. The same symbols that were used above for the cell voltage monitoring device (FIG. 1) of the aforementioned embodiment are adopted here.

In Embodiment 2, in the stage following cell voltage/monitoring current converter 20, monitoring current/monitoring voltage converter 22 is omitted, and current mirror monitoring generator 68 and comparison/evaluation circuit 70 of the current comparison type are added.

In said current mirror monitoring generator 68, PMOS transistor 36 and NMOS transistor 38 are connected in series between first monitoring terminal A and the ground terminal. More specifically, the source terminal of PMOS transistor 36 is connected to first monitoring terminal A on the positive electrode side, and its drain terminal is connected to the ground terminal via NMOS transistor 38. Here, the gate terminal of PMOS transistor 36 is connected to the gate terminal and drain terminal of PMOS transistor 30, and two transistors 30, 36 comprise a current mirror circuit.

When monitoring current $I_M$ flows in cell voltage/monitoring current converter 20, as in said Embodiment 1, due to the current mirroring of current mirror circuit 30, 36, the desired ratio of primary current mirror monitoring current $a^*I_M$ to monitoring current $I_M$ flows in the series circuit of PMOS transistor 36 and NMOS transistor 38.

In said comparison/evaluation circuit 70, NMOS transistors 40, 42 and NMOS transistor 38 form a current mirror circuit, and constant current sources 72, 74 are connected in series with NMOS transistors 40, 42, respectively, between VDD terminal and ground. More specifically, the source terminals of NMOS transistors 40, 42 are connected to the ground terminal, and the drain terminals of NMOS transistors 40, 42 are connected via constant current sources 72, 74 to VDD terminal on the positive electrode side, respectively. The gate terminals of NMOS transistors 40, 42 are connected to the gate terminal and drain terminal of NMOS transistor 38.

Node J between constant current source 72 and NMOS transistor 40 is connected to one input terminal of AND-gate 56 of evaluation signal output circuit 26 via 2-stage inverters 76, 78. Node K between constant current source 74 and NMOS transistor 42 is connected via 1-stage inverter 80 to one input terminal of AND-gate 58 of evaluation signal output circuit 26.

In comparison/evaluation circuit 70, constant current source 72 and NMOS transistor 40 comprise the first current comparator for detecting overdischarging. Said constant current source 72 generates comparison reference current $I_J$ for monitoring the lower threshold or overdischarging. If the current mirror ratio of current mirror circuit 38, 42 is b, then by definition, $I_J = ab^*I_{ML}$. Here, $I_{ML}$ represents the current (lower threshold current) of monitoring current $I_M$ flowing in cell voltage/monitoring current converter 20 when the cell voltage is below a prescribed lower threshold cell voltage, so that battery cell $BT_i$ is identified as being in over-discharged state, as in said Embodiment 1.

When monitoring current $I_M$ flows in cell voltage/monitoring current converter 20, primary current mirror monitoring current $a^*I_M$ that mirrors monitoring current $I_M$ at a prescribed ratio a in current mirror monitoring generator 68 flows in PMOS transistor 36 and NMOS transistor 38. As a result, in the first current comparator of comparison/evaluation circuit 70, first secondary current mirror monitoring current $ab^*I_M$ that mirrors said primary current mirror monitoring current $a^*I_M$ at a prescribed ratio flows as the source current of NMOS transistor 40. If $I_J < ab^*I_M$, because the source current is larger than the current sourced from constant current source 72 to the drain terminal, the potential at node J as the drain terminal of NMOS transistor 40 falls, and an evaluation output signal of logical value L indicating that said cell voltage $V_i$ is within the normal range is obtained from the output terminal of inverters 7, 8. However, If $I_J > ab^*I_M$, the source current is smaller than the current sourced from constant current source 72 to the drain terminal, so that the potential at node J rises. An evaluation output signal of logical value H indicating that cell voltage $V_i$ is below the lower threshold is obtained from the output terminal of inverter 78, that is, indicating the over-discharged state.

Constant current source 74 and NMOS transistor 42 form the second current comparator for detecting over-charging.

Said constant current source 74 generates comparison reference current $I_K$ for monitoring the upper threshold or overcharging. If the current mirror ratio in current mirror circuit 38, 42 is c, then by definition, $I_K=ac*I_{MU}$. Here, $I_{MU}$ represents the current (upper threshold current) of monitoring current $I_M$ flowing in cell voltage/monitoring current converter 20 when the voltage rises to a prescribed high cell voltage indicating that battery cell $BT_i$ is in the overcharged state, as in said Embodiment 1.

When primary current mirror monitoring current $a*I_M$ flows in current mirror monitoring generator 68 as described above, in the second current comparator of comparison/evaluation circuit 70, second secondary current mirror monitoring current $ac*I_M$ that mirrors primary current mirror monitoring current $a*I_M$ at a prescribed ratio c flows as the source current of NMOS transistor 42. If $I_K \cdot ac*I_M$, the source current is smaller than the current sourced from constant current source 72 to the drain terminal, the potential at node K as the drain terminal of NMOS transistor 42 rises, and an evaluation output signal of logical value L indicating that said cell voltage $V_i$ is within the normal range is obtained from the output terminal of inverter 80. If $I_K<ac*I_M$, because the source current is larger than the current sourced from constant current source 72 to the drain terminal, the potential at node K falls, and an evaluation output signal of logical value H indicating that said cell voltage $V_i$ exceeds the upper threshold, that is, indicating the over-charged state, is obtained from the output terminal of inverter 80.

Said cell voltage abnormality detector 14 of said Embodiment 2 has not only the same operation and effects as those of said Embodiment 1, but also a simpler and smaller circuit constitution since voltage comparators 48, 50 have not been omitted.

In the explanation above, embodiments of the present invention were used. However, the present invention is not limited to these embodiments. As long as the technical idea of the present invention is observed, various modifications and changes can be made.

For example, in said Embodiment 1, monitoring current/monitoring voltage converter 22 generates first monitoring voltage $V_F$ for monitoring the lower threshold and second monitoring voltage $V_G$ for monitoring the upper threshold individually, so that it is possible to independently optimize the evaluation logic for voltage comparison in voltage comparators 48, 50 of comparison/evaluation circuit 24. However, although it is not shown in the figures, monitoring current/monitoring voltage converter 22 may generate a single monitoring voltage, so that comparison/evaluation circuit 24 compares said monitoring voltage to compare with the reference voltage for monitoring the lower threshold and to the reference voltage for monitoring the upper threshold by means of voltage comparators 48, 50.

Also, although it is not shown in the figure, in cell voltage abnormality detector 14, PMOS transistors 30, 36, 40, 42 may be replaced with NMOS transistors, and NMOS transistor 38 with a PMOS transistor.

Figure 4:
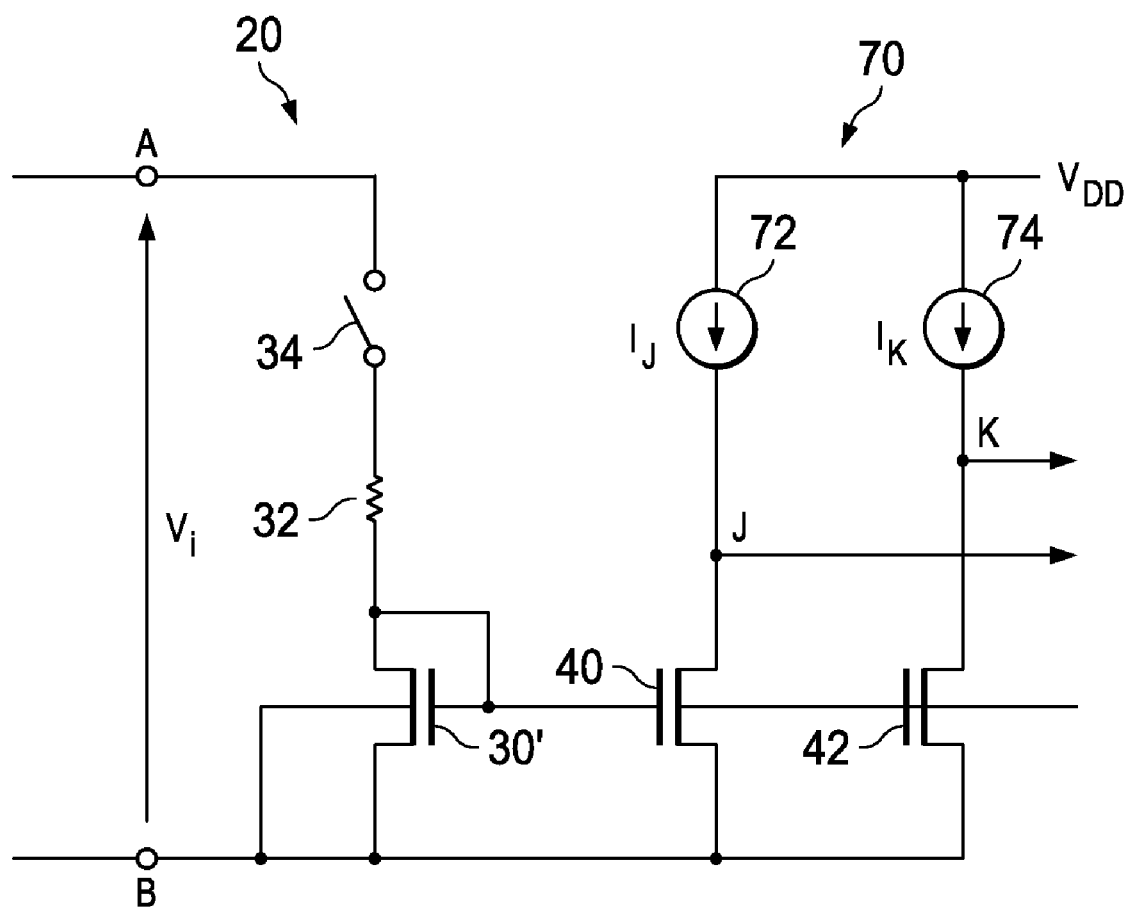
FIG. 4 is a circuit diagram illustrating the constitution of the circuit as the main portion of the cell voltage abnormality detector in a modified example of Embodiment 2 of the present invention.

In said Embodiment 2, current mirror monitoring generator 68 may be omitted, and as shown in FIG. 4, comparison/evaluation circuit 70 is then directly connected to cell voltage/monitoring current converter 20.

In the constitution example shown in FIG. 4, the transistor of cell voltage/monitoring current converter 20 includes NMOS transistor 30'. Said NMOS transistor 30' and NMOS transistor 40 of comparison/evaluation circuit 70 form a current mirror circuit for performing the first current comparison to monitor the lower threshold, and NMOS transistor 30' and NMOS transistor 42 of comparison/evaluation circuit 70 form a current mirror circuit for performing the second current comparison to monitor the upper threshold.

When monitoring current $I_M$ flows in cell voltage/monitoring current converter 20, first current mirror monitoring current $b*I_M$ that mirrors said monitoring current $I_M$ at a prescribed ratio b flows as the source current of NMOS transistor 40. If $I_J \cdot b*I_M$, the potential at node J falls, and an evaluation output signal of logical value L indicating that cell voltage $V_i$ is within the normal range is obtained from the output terminal of inverter 78 in the subsequent stage (FIG. 3). However, if $I_J>b*I_M$, the potential at node J rises, and an evaluation output signal of logical value H indicating that cell voltage $V_i$ is below the lower threshold, that is, indicating the over-discharged state, is obtained from the output terminal of inverter 78.

Also, when monitoring current $I_M$ flows in cell voltage/monitoring current converter 20, second current mirror monitoring current $c*I_M$ that mirrors said monitoring current $I_M$ at a prescribed ratio c flows as the source current of NMOS transistor 42. If $I_K \cdot c*I_M$, the potential of node K rises, and an evaluation output signal of logical value L indicating that cell voltage $V_i$ is within the normal range is obtained from the output terminal of inverter 80 in the subsequent stage (FIG. 3). If $I_K<c*I_M$, the potential at node K falls, and an evaluation output signal of logical value H indicating that cell voltage $V_i$ exceeds the upper threshold, that is, indicating the over-charged state, is obtained from the output terminal of inverter 80.

In the embodiments above, the case in which the desired battery cells $BT_i$ were selected from multi-cell series battery 10 one at a time was explained. However, plural battery cells BT may also be selected as a block, and their total cell voltage is output to monitoring terminals A, B. For example, the following scheme may be adopted: with all of the other switches turned off, only switches SH2, SL1 are turned on, and the cell voltages $(V_1+V_2)$ of two battery cells $BT_1$, $BT_2$ can be sent to monitoring terminals A, B.

The cell voltage abnormality detector and cell voltage monitoring device of the present invention can be used not only in automobile batteries, but also in various other applications in which multi-cell serial batteries are monitored.

Although the present invention has been described with reference to a specific embodiment, it is not limited to this embodiment and no doubt alternatives will occur to the skilled person that lie within the scope of the invention as claimed.

What is claimed is:

1. A cell voltage abnormality detector for a multi-cell series battery made up of plural battery cells connected in series that is used to detect cell voltage abnormalities in at least a single cell of the multi-cell series battery comprising:
   a selection switch for selecting any of the at least single cells of said multi-cell series battery and retrieving cell voltage from between first and second monitoring terminals;
   a cell voltage/monitoring current converter, which has a first transistor connected between said first and second monitoring terminals and which converts the voltage of said battery cell selected by said selection switch into a monitoring current;
   a monitoring current/monitoring voltage converter, which has a second transistor that, in combination with said first transistor, forms a current mirror circuit, and which converts the monitoring current generated by said cell voltage/monitoring current converter into a monitoring voltage; and a comparison/evaluation circuit, which compares said monitoring voltage obtained by said monitoring current/monitoring voltage converter with a prescribed reference voltage and which determines whether the voltage of said battery cell selected by said selection switch is outside of a predetermined normal range.

2. A cell voltage abnormality detector for a multi-cell series battery that is used to detect cell voltage abnormalities in at least a single cell of the multi-cell series battery made up of plural battery cells connected in series comprising:
- a selection switch for selecting any of the at least single cells of said multi-cell series battery and retrieving cell voltage from between first and second monitoring terminals,
- a cell voltage/monitoring current converter, which has a first transistor connected between said first and second monitoring terminals and which converts the voltage of said battery cell selected by said selection switch into a monitoring current;
- a current mirror monitoring current generator, which has a second transistor that, in combination with said first transistor, forms a current mirror circuit, and which proportionally generates a current mirror monitoring current that is in a predetermined ratio to said current monitoring current; and
- a comparison/evaluation circuit, which compares said current mirror monitoring current generated by said current mirror monitoring current generator with a predetermined reference current, and which determines whether the voltage of said battery cell selected by said selection switch is outside of a predetermined normal range.

3. A cell voltage abnormality detector for a multi-cell series battery that is used to detect cell voltage abnormalities in at least a single cell of the multi-cell series battery made up of plural battery cells connected in series comprising:
- a selection switch for selecting any of the at least single cells of said multi-cell series battery and retrieving cell voltage from between the first and second monitoring terminals,
- a cell voltage/monitoring current converter, which has a first transistor connected between said first and second monitoring terminals and which converts the voltage of said battery cell selected by said selection switch into a monitoring current; and
- a comparison/evaluation circuit, which has a second transistor that, in combination with said first transistor, forms a current mirror circuit, and which compares said monitoring current generated by said cell voltage/monitoring current converter with a predetermined reference current, and judges whether the voltage of said battery cell selected by said selection switch is outside of a predetermined normal range.

4. The cell voltage abnormality detector of claim 1 wherein said cell voltage/monitoring current converter has a resistor connected in series with said first transistor between said first and second monitoring terminals.

5. The cell voltage abnormality detector of claim 1 wherein said cell voltage/monitoring current converter has a resistor connected in series with said first transistor between said first and second monitoring terminals.

6. The cell voltage abnormality detector of claim 2 wherein said cell voltage/monitoring current converter has an on/off switch connected in series with said first transistor between said first and second monitoring terminals.

7. The cell voltage abnormality detector of claim 2 wherein said cell voltage/monitoring current converter has a resistor connected in series with said first transistor between said first and second monitoring terminals.

8. The cell voltage abnormality detector of claim 3 wherein said cell voltage/monitoring current converter has an on/off switch connected in series with said first transistor between said first and second monitoring terminals.

9. The cell voltage abnormality detector of claim 3 wherein said cell voltage/monitoring current converter has a resistor connected in series with said first transistor between said first and second monitoring terminals.

10. A cell voltage abnormality detector for a multi-cell series battery that is used to detect cell voltage abnormalities in at least a single cell of the multi-cell series battery made up of plural battery cells connected in series comprising:
- a selection switch for selecting any of the at least single cells of said multi-cell series battery and retrieving cell voltage from between the first and second monitoring terminals,
- a first transistor connected between said first and second monitoring terminals,
- a second transistor which, in combination with said first transistor, forms a first current mirror circuit;
- a current/voltage converter that converts the current flowing in said second transistor into a monitoring voltage; and,
- a comparison/evaluation circuit, which compares said monitoring voltage obtained by said current/voltage converter with a predetermined reference voltage and which determines whether the voltage of said battery cell selected by said selection switch is outside of a predetermined normal range.

11. The cell voltage abnormality detector of claim 10 wherein:
- said current/voltage converter comprises
- a third transistor connected in series with said second transistor between said first monitoring terminal and a first power supply voltage terminal,
- a fourth transistor which, in combination with said third transistor, forms a second current mirror circuit,
- and a first resistor connected in series with said fourth transistor between the second and third power supply voltage terminals that produces the prescribed voltage drop;
- said monitoring voltage is retrieved from the node between said fourth transistor and said first resistor;
- and wherein said comparison/evaluation circuit comprises:
- a first voltage comparator, which compares said monitoring voltage with a first comparison reference voltage for monitoring the lower threshold and outputs a dual-value evaluation signal that indicates the relative high/low relationship between the two voltages,
- and a second voltage comparator, which compares said monitoring voltage with the second comparison reference voltage for monitoring the upper threshold and outputs a dual-value evaluation signal indicating the relative high/low relationship between the two voltages.

12. A cell voltage abnormality detector for multi-cell series battery that is used to detect cell voltage abnormalities in at least a single cell of the multi-cell series battery made up of plural battery cells connected in series comprising:
- a selection switch for selecting any of the at least single cells of said multi-cell series battery and retrieving cell voltage from between the first and second monitoring terminals;
- a first transistor connected between said first and second monitoring terminals;

a second transistor which, in combination with said first transistor, forms a first current mirror circuit;

a current/voltage converter that converts the current flowing in said second transistor into a first monitoring voltage for monitoring the upper threshold and a second monitoring voltage for monitoring the lower threshold; and a comparison/evaluation circuit, which compares said first and second monitoring voltages obtained by said current/voltage converter with first and second reference voltages, respectively, and which determines whether the voltage of said battery cell selected by said selection switch is outside of a predetermined normal range.

13. The cell voltage abnormality detector of claim 12 wherein:

said current/voltage converter comprises;

a third transistor connected in series with said second transistor between said first monitoring terminal and a first power supply voltage terminal;

a fourth transistor which, in combination with said third transistor, forms a second current mirror circuit;

a first resistor connected in series with said fourth transistor between the second and third power supply voltage terminals that produces the prescribed voltage drop;

a fifth transistor which, in combination with said third transistor, forms a third current mirror circuit;

and a second resistor connected in series with said fifth transistor between said second and third power supply voltage terminals, wherein said first monitoring voltage is retrieved from the node between said fourth transistor and said first resistor, and said second monitoring voltage is retrieved from the node between said fifth transistor and said second resistor.

14. A cell voltage abnormality detector for a multi-cell series battery that is used to detect cell voltage abnormalities in at least a single cell of the multi-cell series battery made up of plural battery cells connected in series comprising:

a selection switch for selecting any of the at least single cells of said multi-cell series battery and retrieving its voltage from between the first and second monitoring terminals;

a first transistor connected between said first and second monitoring terminals;

a second transistor which, in combination with said first transistor, forms a first current mirror circuit; and a comparison/evaluation circuit, which compares the current flowing in said second transistor with a reference current, and which determines whether the voltage of said battery cell selected by said selection switch is outside of a predetermined normal range.

15. The cell voltage abnormality detector of claim 14 wherein said comparison/evaluation circuit comprises:

a third transistor connected in series with said second transistor between said first monitoring terminal and a first power supply voltage terminal;

a fourth transistor which, in combination with said third transistor, forms a second current mirror circuit;

a first constant current source connected in series with said fourth transistor between the second and third power supply voltage terminals that produces a prescribed voltage;

a fifth transistor which, in combination with said third transistor, forms a third current mirror circuit;

and a second constant current source that is connected in series with said fifth transistor between said second and third power supply voltage terminals and that is used to monitor the upper threshold wherein a first evaluation signal indicating whether the voltage of said battery cell is lower than a prescribed lower threshold is retrieved from the node between said fourth transistor and said first constant current source, and a second evaluation signal indicating whether the output voltage of said battery cell exceeds a prescribed upper threshold is retrieved from the node between said fourth transistor and said second constant current source.

16. A cell voltage abnormality detector for multi-cell series battery that is used to detect cell voltage abnormalities in at least a single cell of the multi-cell series battery made up of plural battery cells connected in series comprising:

a selection switch for selecting any of the at least single cells of said multi-cell series battery and retrieving its voltage from between the first and second monitoring terminals, a first transistor connected between said first and second monitoring terminals, and a comparison/evaluation circuit, which compares the current flowing in said first transistor with a reference current, and which determines whether the voltage of said battery cell selected by said selection switch is outside of a prescribed normal range.

17. The cell voltage abnormality detector of claim 16 characterized in that said comparison/evaluation circuit comprises for monitoring a lower threshold, a second transistor which, in combination with said first transistor, forms a first current mirror circuit, and a first constant current source connected in series with said second transistor between said first monitoring terminal and a prescribed power supply voltage terminal, and for monitoring an upper threshold, a third transistor which, in combination with said first transistor, forms a second current mirror circuit, and a second constant current source that is connected in series with said third transistor between said first monitoring terminal and said power supply voltage terminal;

wherein a first evaluation signal indicating whether the voltage of said battery cell is lower than a prescribed lower threshold is retrieved from the node between said second transistor and said first constant current source, and a second evaluation signal indicating whether the output voltage of said battery cell exceeds a prescribed upper threshold is retrieved from the node between said third transistor and said second constant current source.

18. The cell voltage abnormality detector of claim 10 wherein a third resistor is connected in series with said first transistor between said first and second monitoring terminals.

19. The cell voltage abnormality detector of claim 10 wherein it has an on/off switch that is connected in series with said first transistor between said first and second monitoring terminals.

20. A cell voltage monitoring device for a multi-cell series battery comprising:

the cell voltage abnormality detector described in claim 1, and a cell voltage measurement circuit that measures the voltage of each cell of said multi-cell series battery.

21. The cell voltage monitoring device of claim 20 wherein said cell voltage measurement circuit is comprised of the following parts:

a sampling switch for sampling the output voltage of said battery cell selected by said sampling switch;

a capacitor that is charged by the voltage sampled by said sampling switch; and an A/D converter that converts the charge voltage on said capacitor into a digital signal, and a transfer switch for transferring the charge voltage on said capacitor to said A/D converter.

22. The cell voltage monitoring device of claim 21 wherein immediately after the start of the first half-period when the voltage of a given battery cell is selected by said sampling switch, said cell voltage abnormality detector is turned on to determine whether the battery cell voltage is normal or abnormal.

\* \* \* \* \*